(12) United States Patent
Yang

(10) Patent No.: US 8,008,859 B2
(45) Date of Patent: Aug. 30, 2011

(54) ORGANIC LIGHT EMITTING DISPLAY DEVICE

(75) Inventor: Nam-Choul Yang, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 394 days.

(21) Appl. No.: 12/368,806

(22) Filed: Feb. 10, 2009

(65) Prior Publication Data

US 2009/0295280 A1    Dec. 3, 2009

(30) Foreign Application Priority Data

Jun. 3, 2008    (KR) .................. 10-2008-0052097

(51) Int. Cl.
*H01L 51/50* (2006.01)
*H01L 51/52* (2006.01)
(52) U.S. Cl. ......... 313/506; 313/503; 313/504; 313/509
(58) Field of Classification Search ........... 313/500–512
See application file for complete search history.

(56) References Cited

U.S. PATENT DOCUMENTS

| | | | | |
|---|---|---|---|---|
| 7,795,809 B2 * | 9/2010 | Ito et al. | ....................... | 313/506 |
| 7,898,170 B2 * | 3/2011 | Kobayashi | .................... | 313/504 |
| 2007/0126352 A1 * | 6/2007 | Okutani | ....................... | 313/506 |

FOREIGN PATENT DOCUMENTS

| | | | | |
|---|---|---|---|---|
| JP | 2003100465 A | * | 4/2003 | |
| JP | 2004-047194 | | 2/2004 | |
| JP | 2006128077 A | * | 5/2006 | |
| KR | 2003-0069434 | | 8/2003 | |
| KR | 10-2005-0029826 | | 3/2005 | |
| KR | 10-2005-0051646 | | 6/2005 | |
| KR | 10-2006-0001710 | | 1/2006 | |
| KR | 10-2006-0022876 | | 3/2006 | |
| KR | 10-2007-0034816 | | 3/2007 | |
| KR | 10-2007-0052625 | | 5/2007 | |

OTHER PUBLICATIONS

KIPO Office Action dated Jul. 31, 2009, for priority Korean Application 10-2008-0052097, noting listed references in this IDS.

* cited by examiner

*Primary Examiner* — Mariceli Santiago
(74) *Attorney, Agent, or Firm* — Christie, Parker & Hale, LLP

(57) ABSTRACT

An organic light emitting display for minimizing light from entering the pixels is provided. The organic light emitting display includes a substrate including a pixel region and a pixel-separating region between pixel regions; a first insulating layer on the substrate; a first electrode in a pixel region and on the first insulating layer; a pixel definition layer overlapping an edge region of the first electrode and in a region between the pixel region and the pixel-separating region; an organic light emitting layer on the first electrode and the pixel definition layer; a second electrode on the organic light emitting layer; and a black matrix between the first insulating layer and the pixel definition layer and extending outwardly past an edge region of the pixel definition layer into the pixel-separating region, such that the pixel definition layer is separated from the first insulating layer.

17 Claims, 3 Drawing Sheets

ORGANIC LIGHT EMITTING DISPLAY DEVICE

CROSS-REFERENCE TO RELATED APPLICATION

This application claims priority to and the benefit of Korean Patent Application No. 10-2008-0052097, filed on Jun. 3, 2008, in the Korean Intellectual Property Office, the entire content of which is incorporated herein by reference.

BACKGROUND OF THE INVENTION

1. Field of the Invention

The present invention relates to an organic light emitting display device.

2. Description of Related Art

In recent years, various flat panel displays have been developed, which are relatively light-weight and smaller compared to cathode ray tubes. Among these flat panel display devices, organic light emitting display devices have come into the spotlight as the next-generation display device since organic light emitting display devices have excellent luminance and color purity by using organic compounds as the light emitting material.

However, in a conventional organic light emitting display device, the contrast may be compromised since external light is reflected by metallic materials such as thin film transistors, capacitors, and wires, all of which may be found in a display unit.

In order to minimize reductions in contrast caused by the reflection of external light, an expensive polarizing plate is often attached to the front of the conventional display device. However, the use of the polarizing plate results in increased manufacturing costs, and further reduces luminance or brightness since the polarizing plate also blocks some of the light emitted from a light emitting layer of each pixel.

Meanwhile, since organic light emitting display devices are thin, light-weight, and driven using low power consumption, organic light emitting display devices are also anticipated to be widely utilized in the field of portable display devices. Portable display devices are exposed to various external environments, which may affect the visibility of images. In order to reduce variations in the visibility of the images, a photosensor may be installed to detect a level of external light, whereby the detected level of external light my be used to control the luminance of the display unit.

However, while images are displayed on a screen of the portable display device, the light emitted from the display unit may be detected by the photosensor, so as to reduce the reliability of the photosensor. Thus, light emitted from the display unit may affect the accuracy of the photosensor. Also, a thin film transistor ('TFT') formed in a lower portion of the organic light emitting diode may further be sensitive to the light.

SUMMARY OF THE INVENTION

Accordingly, an aspect of an embodiment according to the present invention is to provide an organic light emitting display device capable of reducing or minimizing the amount of light reaching the TFT, as well as reducing or minimizing the reflection of external light, without the use of a separate polarizing plate.

One embodiment of the present invention provides an organic light emitting display device, including: a substrate having a plurality of pixel regions, wherein each of the plurality of pixel regions includes a pixel, and a plurality of pixel-separating regions around the pixel regions; a first insulating layer on the substrate; a first electrode in the pixel region and on the first insulating layer; a pixel definition layer overlapping an edge region of the first electrode and in a region between the pixel region and the pixel-separating region, the pixel definition layer separating the pixel from adjacent pixels of the plurality of pixels and exposing the first electrode in a light emitting region of the pixel; an organic light emitting layer on the first electrode and the pixel definition layer; a second electrode on the organic light emitting layer; and a black matrix between the first insulating layer and the pixel definition layer extending outwardly past an edge region of the pixel definition layer into the pixel-separating region, such that the pixel definition layer is separated from the first insulating layer.

Here, the black matrix may extend below at least an edge region of the first electrode.

Also, the organic light emitting display device according to the present invention may further include a second insulating layer on the black matrix, such that the black matrix is separated from the first electrode, the pixel definition layer, and the organic light emitting layer. In this case, the second insulating layer may extend into the light emitting region. The black matrix may extend into the pixel-separating region and may be coupled to a black matrix of at least one adjacent pixel region of the plurality of pixel regions.

In addition, the organic light emitting display device according to the present invention may further include driving elements between the substrate and the first insulating layer and coupled to the first electrode through a via hole in the first insulating layer. Here, the black matrix may be formed on the first insulating layer over at least a portion of the driving elements.

Additionally, the first insulating layer may be a planarization layer.

Also, a separate black matrix may be formed for each pixel region of the plurality of pixel regions.

In addition, the black matrix may include a material selected from the group consisting of a chromium monolayer film, a bilayer chromium film/chromium oxide film, a bilayer molybdenum film/molybdenum oxide film, and combinations thereof.

Another embodiment of the present invention provides a pixel having a pixel region and a pixel-separating region, including: a substrate; a first insulating layer on the substrate; a black matrix on portions of the first insulating layer; a first electrode in the pixel region and on the first insulating layer and the black matrix; a pixel definition layer overlapping an edge region of the first electrode in a region between the pixel region and the pixel-separating region, the pixel definition layer exposing the first electrode in a light emitting region of the pixel region, and separating the pixel from adjacent pixels; an organic light emitting layer on the first electrode and the pixel definition layer; and a second electrode on the organic light emitting layer; wherein the black matrix extends outwardly past an edge region of the pixel definition layer into the pixel-separating region, such that the pixel definition layer is separated from the first insulating layer.

According to aspects of embodiments of the present invention, provided is an organic light emitting display device which reduces or minimizes the reflection of external light without the provision of a polarizing plate, by including a black matrix on a first insulating layer (e.g., a planarization layer).

Also, an optical waveguide may be blocked between the planarization layer and the pixel definition layer by including a margin of the black matrix separating the pixel definition layer from the planarization layer. Therefore, it may be possible to effectively reduce or minimize light from reaching, for example, photosensitive driving elements in the pixel.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION OF EXEMPLARY EMBODIMENTS

Figure 1:
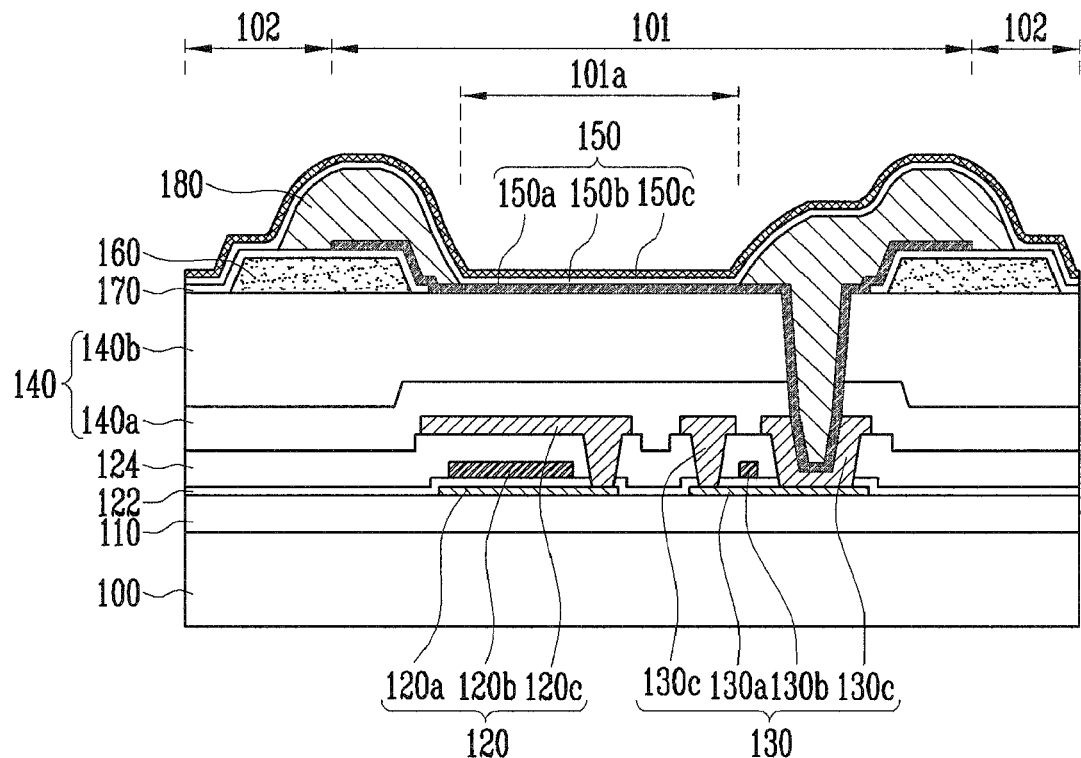
FIG. 1 is a cross-sectional view illustrating a pixel according to one embodiment of the present invention.

In the following detailed description, certain exemplary embodiments of the present invention will be shown and described by way of illustration. As those skilled in the art would realize, the described embodiments may be modified in various different ways without departing from the spirit or scope of the present invention. Accordingly, the drawings and description are to be regarded as illustrative in nature and not restrictive. In addition, when an element is referred to as being "on" another element, it can be directly on the element or be indirectly on the element with one or more intervening elements interposed therebetween. Also, when an element is referred to as being "connected to" another element, it can be directly connected to the element or alternatively be indirectly connected to the element with one or more intervening elements interposed therebetween. Hereinafter, like reference numerals refer to like elements.

Figure 2:
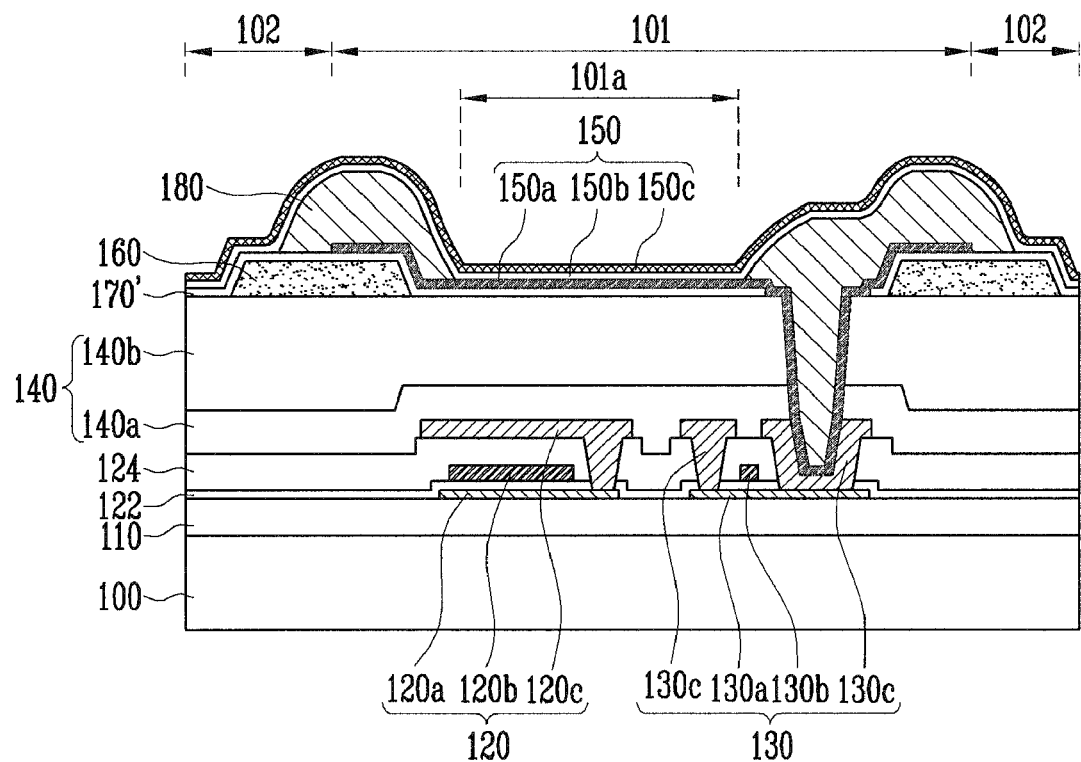
FIG. 2 is a cross-sectional view illustrating a pixel according to another embodiment of the present invention.

FIG. 1 is a cross-sectional view illustrating a pixel according to one embodiment of the present invention, and FIG. 2 is a cross-sectional view illustrating a pixel according to another embodiment of the present invention. For convenience, FIGS. 1 and 2 illustrate only a major section of a corresponding pixel.

The organic light emitting display device includes a display unit having a plurality of pixel regions having pixels formed therein, and pixel-separating regions between the pixels. Exemplary embodiments of the present invention, for example, as shown in FIGS. 1 and 2, may be applied to a plurality of the pixels.

Referring to FIG. 1 and to FIG. 2, the substrate 100 includes a pixel region 101 having a pixel formed therein; and pixel-separating region 102 between pixels. Here, driving elements 120 and 130 for driving pixels and an organic light emitting diode 150 are formed in the pixel region 101. A black matrix 160 and a pixel definition layer 180 are formed at a boundary region between the pixel region 101 and the pixel-separating region 102.

More particularly, the pixel region 101 includes a capacitor 120 and a thin film transistor ('TFT') 130 formed on the buffer layer 110, which, in turn, is formed on the substrate 100; a first insulating layer (a planarization layer) 140 formed on the capacitor 120 and the TFT 130; and an organic light emitting diode 150 formed on the first insulating layer 140 and electrically coupled to the TFT 130 through a via hole formed in the first insulating layer 140.

Here, the capacitor 120 is formed with a dual structure. The capacitor 120 includes a first electrode layer 120a on the buffer layer 110; a second electrode layer 120b on a gate insulating layer 122; and a third electrode layer 120c on an interlayer insulating layer 124 and coupled to the first electrode layer 120a through a contact hole. The first electrode layer 120a may be formed by doping concurrently formed poly silicon with a semiconductor layer 130a of the TFT 130. Each of the second electrode layer 120b and the third electrode layer 120c may likewise be formed at the same time as a gate electrode 130b and a source/drain electrode 130c of the TFT 130 using a gate metal and a source/drain metal, respectively.

The TFT 130 includes a semiconductor layer 130a on the buffer layer 110; a gate electrode 130b on the gate insulating layer 122, which is, in turn, on the semiconductor layer 130a; and a source/drain electrode 130c on the interlayer insulating layer 124 and coupled to the semiconductor layer 130a through a contact hole.

A first insulating layer 140 is formed as an insulating planarization layer on the capacitor 120 and the TFT 130. Here, the first insulating layer 140 may be a multilayer structure including an organic/inorganic insulating layer. For example, the first insulating layer 140 may include a first planarization layer 140a of an inorganic insulating layer and a second planarization layer 140b of an organic insulating layer.

In the pixel region 101 and on the first insulating layer 140 is a first electrode (for example, an anode electrode) 150a of the organic light emitting diode that is coupled to the thin film transistor 130 through a via hole in the first insulating layer 140.

Also, on the first electrode 150a is a pixel definition layer 180 that overlaps with an edge region of the first electrode 150a, whereby the first electrode 150a is exposed in a light emitting region 101a of the pixel.

An organic light emitting layer 150b of the organic light emitting diode is formed on the exposed first electrode 150a and the pixel definition layer 180. A second electrode (for example, a cathode electrode) 150c of the organic light emitting diode is formed on the organic light emitting layer 150b.

In the present invention, a black matrix 160 including a light blocking material, and a second insulating layer 170 covering the top of the black matrix 160 are formed between the first insulating layer 140 and the pixel definition layer 180.

More particularly, the black matrix 160 is disposed in a region including an edge region of the first electrode 150a and an edge region of the pixel definition layer 180 in a region between the pixel region 101 and the pixel-separating region 102, as shown in FIGS. 1 and 2.

In particular, a margin of the black matrix 160 extends outwardly of the pixel definition layer 180 into the pixel-separating region 102, thereby separating the pixel definition layer 180 from the first insulating layer 140. Here, the term 'margin' means an edge, and particularly an outer edge. In other words, the margin of the black matrix 160 is further out than the margin of the pixel definition layer 180 in one embodiment of the present invention.

As a result, the external light and/or the light generated in the organic light emitting layer 150b is blocked by the black matrix 160 at boundary regions between the pixel region 101 and the pixel-separating region 102, and thus external light and/or generated light are not transmitted to the first insulating layer 140 in those regions. Therefore, it is possible to effectively reduce or minimize light entering at least those regions of the display unit.

Also, when, for example, wires are positioned below the black matrix 160, external light and/or light generated in the organic light emitting layer 150b is blocked from the wires, thereby reducing reflection of the light. Thus, one embodiment of the present invention reduces the reflection of external light, without a separate polarizing plate, by forming the black matrix 160 on the first insulating layer 140.

Meanwhile, for example, at least one material selected from the group consisting of chromium (Cr) (or, chromium alloy), molybdenum (Mo) (or, molybdenum alloy), their oxides (CrOx, MoOx), and combinations thereof may be used as the light blocking material in the black matrix 160.

For example, the black matrix 160 may include a chromium monolayer film, or may include a bilayer chromium film/chromium oxide film, or a bilayer molybdenum film/molybdenum oxide film, for blocking light in an effective manner.

The second insulating layer 170 may be provided to secure stability of the organic light emitting diode 150. More particularly, where the black matrix 160 includes a conductive material, the first electrode 150a may be in contact with the black matrix 160 if a second insulating layer 170 is not provided. In this case, in some regions, the black matrix 160 may contact organic light emitting layer 150b, which may, in turn, contact second electrode 150c, coupled to the first electrode 150a. Therefore, stability of the organic light emitting diode 150 may be compromised by, for example, increasing the likelihood of a short circuit.

Thus, the exemplary embodiments include a second insulating layer 170 covering a top surface of the black matrix 160 and separating the black matrix 160 from the first electrode 150a, the pixel definition layer 180 and the organic light emitting layer 150b.

However, the present invention is not limited thereto. For example, when stability of the organic light emitting diode 150 is not an issue, such as when the organic light emitting layer 150b has a relatively minimal thickness such that the probability of a short circuit is very low, the second insulating layer 170 may be omitted.

Meanwhile, FIG. 1 shows one embodiment in which the second insulating layer 170 covers the top of the black matrix 160, but the present invention is not limited thereto. For example, it is apparent to those skilled in the art that a second insulating layer 170' may further be formed below the first electrode 150a so that the second insulating layer 170' extends into the light emitting region 101a of the pixels, as shown in FIG. 2.

As described above, exemplary embodiments of the present invention disclose a black matrix 160 that effectively reduces or minimizes external light and/or light generated in the emitting layer 150b from entering regions of the display unit covered by the black matrix 160, as well as reflection of external light, without a separate polarizing plate. Therefore, the contrast may be improved without compromising luminance. Further, the reliability of photosensors may be enhanced by reducing light interference.

Figure 3:
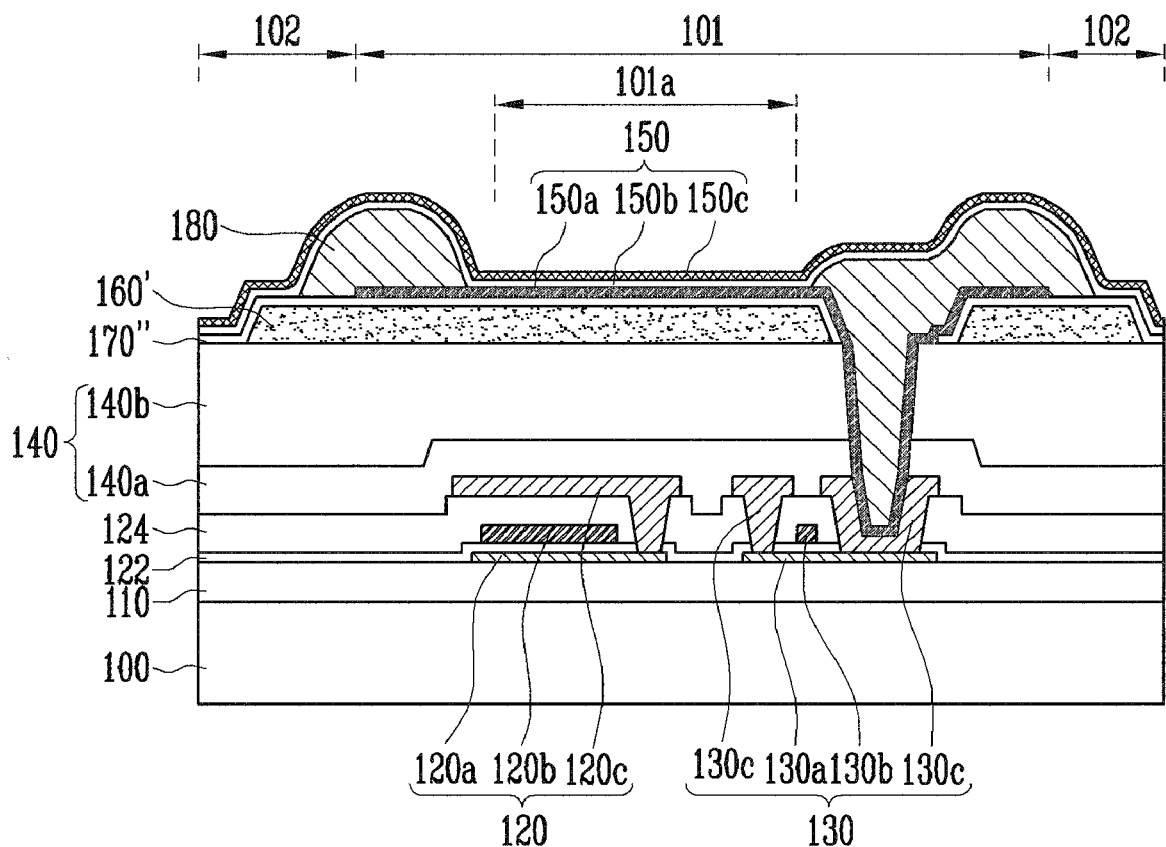
FIG. 3 is a cross-sectional view illustrating a pixel according to still another embodiment of the present invention.

FIG. 3 is a cross-sectional view illustrating a pixel according to another embodiment of the present invention. In FIG. 3, the same parts have the same reference numerals as in FIGS. 1 and 2, thus further description of the same parts are omitted.

Referring to FIG. 3, a black matrix 160' may be formed on the first insulating layer 140 so that the black matrix 160' extends into the light emitting region 101a of the pixels, covering the top of the driving elements, such as the capacitor 120 and the TFT 130.

When the black matrix 160' covers the top of the driving elements 120 and 130 as described above, external light may be blocked from being reflected by the driving elements 120 and 130. Therefore, the contrast may be more effectively preserved. Furthermore, the light generated in the organic light emitting layer 150b may also be blocked from being transmitted to the driving elements 120 and 130. Therefore, operation of the pixels may be improved by preserving the reliability of photosensitive elements such as TFT 130.

Figure 4:
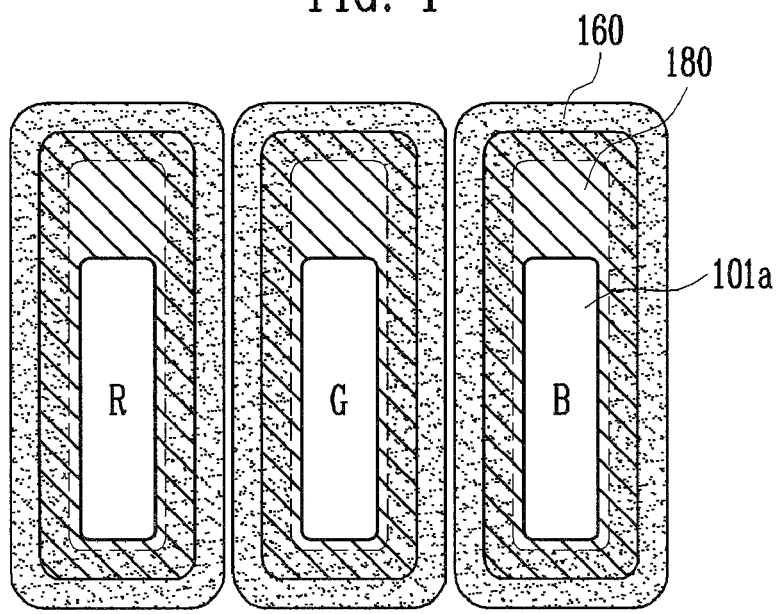
FIG. 4 is a top view illustrating an example of a black matrix pattern according to one embodiment of the present invention.
Figure 5:
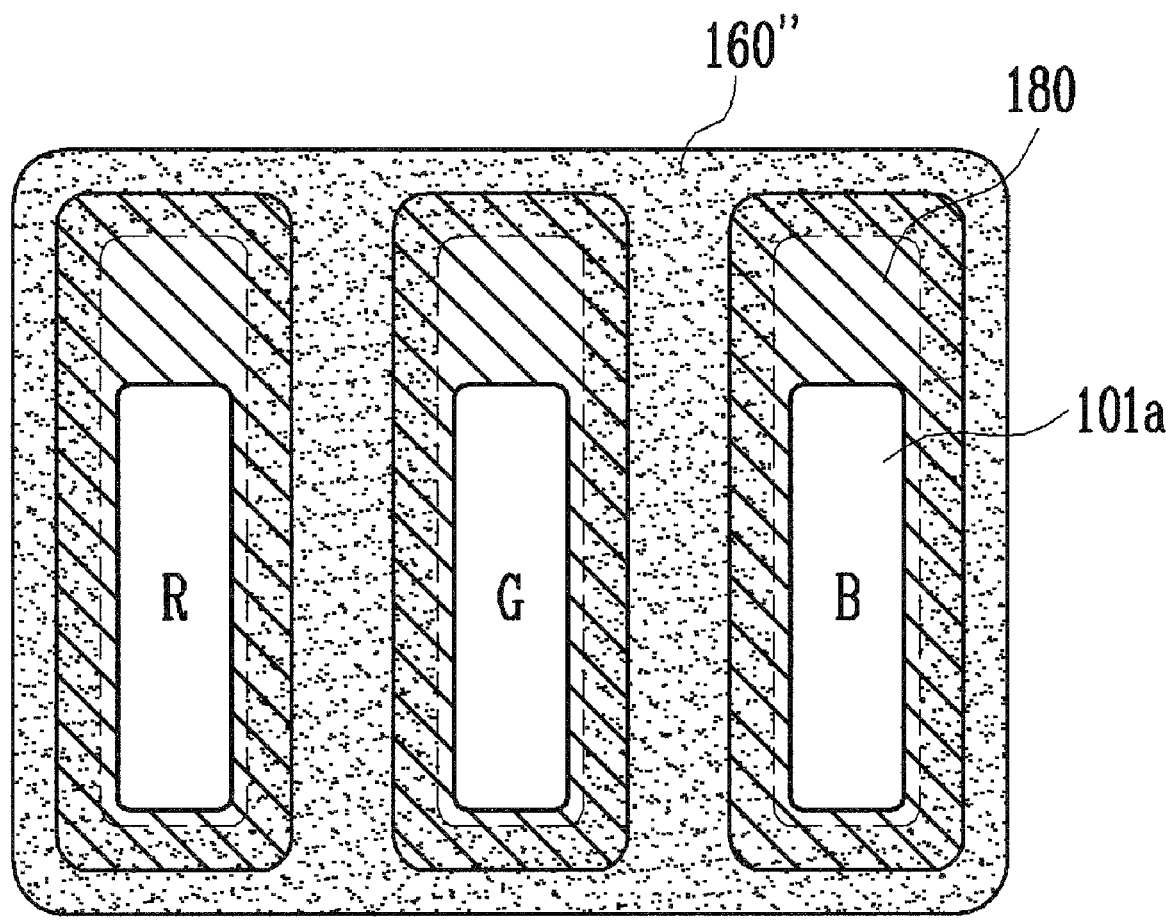
FIG. 5 is a top view illustrating an example of a black matrix pattern according to another embodiment of the present invention.

FIG. 4 is a top view illustrating an example of a black matrix pattern according to one embodiment of the present invention, and FIG. 5 is a top view illustrating an example of a black matrix pattern according to another embodiment of the present invention. Unnecessary components are omitted to clearly illustrate the examples of the black matrix patterns in FIGS. 4 and 5.

Referring to FIG. 4, the pixel definition layer 180 has an opening through which the light emitting region 101a of each of the pixels is exposed. The black matrix 160 is formed along outer portions of the pixel definition layer 180 so that the black matrix 160 overlaps an edge of the pixel definition layer 180, and is patterned to be separated by pixel regions.

Meanwhile, the present invention is not particularly limited to the pattern of the black matrix 160 in FIG. 4. For example, a black matrix 160" may be patterned to be entirely coupled through pixel-separating regions, as shown in, for example, FIG. 5. Here, the black matrices 160" for separate red, green and blue pixels (R,G,B) constituting a unit pixel are coupled to each other. The black matrix 160" may have a pattern that encompasses the entire display unit. In this case, an insulating layer covering the top of the black matrix 160" may be interposed, for example, to reduce the possibility of short circuits between the pixels.

Also, although not shown herein, an organic light emitting display device using a structure of the black matrix 160' as shown in FIG. 3 may further have a black matrix 160' extending into the light emitting regions 101a.

In other words, the present invention is not particularly limited to the patterns of the black matrices 160, 160' and 160". The black matrix may be formed with various different patterns without hindering operation of the pixels.

While the present invention has been described with respect to certain exemplary embodiments, it is to be understood that the invention is not limited to the disclosed embodiments, but instead is intended to cover various modifications and equivalent arrangements included within the spirit and scope of the appended claims and equivalents thereof.

What is claimed is:

1. An organic light emitting display device, comprising:
   a substrate having a plurality of pixel regions, each of the plurality of pixel regions including a pixel, and a plurality of pixel-separating regions around the pixel regions;
   a first insulating layer on the substrate;
   a first electrode in the pixel region and on the first insulating layer;
   a pixel definition layer overlapping an edge region of the first electrode and in a region between the pixel region and the pixel-separating region, the pixel definition layer separating the pixel from adjacent pixels of the plurality of pixels and exposing the first electrode in a light emitting region of the pixel;
   an organic light emitting layer on the first electrode and the pixel definition layer;
   a second electrode on the organic light emitting layer; and a black matrix between the first insulating layer and the pixel definition layer extending outwardly past an edge region of the pixel definition layer into the pixel-separating region, such that the pixel definition layer is separated from the first insulating layer.

2. The organic light emitting display device according to claim 1, wherein the black matrix extends below at least an edge region of the first electrode.

3. The organic light emitting display device according to claim 1, further comprising a second insulating layer on the black matrix, such that the black matrix is separated from the first electrode, the pixel definition layer, and the organic light emitting layer.

4. The organic light emitting display device according to claim 3, wherein the second insulating layer extends into the light emitting region.

5. The organic light emitting display device according to claim 3, wherein the black matrix extends into the pixel-separating region and is coupled to a black matrix of at least one adjacent pixel region of the plurality of pixel regions.

6. The organic light emitting display device according to claim 1, further comprising driving elements between the substrate and the first insulating layer and coupled to the first electrode through a via hole in the first insulating layer.

7. The organic light emitting display device according to claim 6, wherein the black matrix is formed on the first insulating layer over at least a portion of the driving elements.

8. The organic light emitting display device according to claim 1, wherein the first insulating layer is a planarization layer.

9. The organic light emitting display device according to claim 1, wherein a separate black matrix is formed for each pixel region of the plurality of pixel regions.

10. The organic light emitting display device according to claim 1, wherein the black matrix comprises a material selected from the group consisting of a chromium monolayer film, a bilayer chromium film/chromium oxide film, a bilayer molybdenum film/molybdenum oxide film, and combinations thereof.

11. A pixel having a pixel region and a pixel-separating region, comprising:
a substrate;
a first insulating layer on the substrate;
a black matrix on portions of the first insulating layer;
a first electrode in the pixel region and on the first insulating layer and the black matrix;
a pixel definition layer overlapping an edge region of the first electrode in a region between the pixel region and the pixel-separating region, the pixel definition layer exposing the first electrode in a light emitting region of the pixel region, and separating the pixel from adjacent pixels;
an organic light emitting layer on the first electrode and the pixel definition layer; and
a second electrode on the organic light emitting layer;
wherein the black matrix extends outwardly past an edge region of the pixel definition layer into the pixel-separating region, such that the pixel definition layer is separated from the first insulating layer.

12. The pixel according to claim 11, wherein the black matrix extends below at least an edge region of the first electrode.

13. The pixel according to claim 11, wherein the black matrix extends below the first electrode into the light emitting region.

14. The pixel according to claim 13, further comprising driving elements between the substrate and the first insulating layer in the light emitting region, such that the black matrix extends over the driving elements.

15. The pixel according to claim 11, further comprising a second insulating layer on the black matrix, such that the black matrix is separated from the first electrode, the pixel definition layer, and the organic light emitting layer.

16. The pixel according to claim 15, wherein the second insulating layer extends into the light emitting region.

17. The pixel according to claim 11, wherein the first insulating layer is a planarization layer.

* * * * *